United States Patent [19]

Graupe et al.

[11] 4,188,667
[45] Feb. 12, 1980

[54] ARMA FILTER AND METHOD FOR DESIGNING THE SAME

[76] Inventors: Daniel Graupe, 2821 Redwing; Aloysius A. Beex, 33-L Aggie Village, both of Fort Collins, Colo. 80521; G. Donald Causey, 3504 Dunlop, Chevy Chase, Md. 20015

[21] Appl. No.: 852,917

[22] Filed: Nov. 18, 1977

Related U.S. Application Data

[62] Division of Ser. No. 660,513, Feb. 23, 1976.

[51] Int. Cl.² ............... G06F 15/34; H04R 25/00
[52] U.S. Cl. .......................... 364/724; 179/1 FS; 179/107 R; 179/107 FD
[58] Field of Search .......... 364/724; 179/1 F, 1 FS, 179/107 R, 107 E, 107 FD

[56] References Cited

U.S. PATENT DOCUMENTS

| | | | |
|---|---|---|---|
| 3,385,937 | 5/1968 | Lafon | 179/107 R |
| 3,755,749 | 8/1973 | Van Ryswyk et al. | 179/1 FS X |
| 3,763,333 | 10/1973 | Lichowsky | 179/107 R |
| 3,800,093 | 3/1974 | Wolf | 179/15 BC |
| 3,848,091 | 11/1974 | Stearns et al. | 179/107 FD X |
| 3,927,279 | 12/1975 | Nakamura et al. | 179/107 FD |

OTHER PUBLICATIONS

R. W. Schafer, "A Survey of Digital Speech Processing Techniques", *IEEE Trans. on Audio and Electroacoustics*, vol. AU-20, Mar. 1972, pp. 28–35.

*Primary Examiner*—Jerry Smith
*Attorney, Agent, or Firm*—Sandler & Greenblum

[57] ABSTRACT

A near minimum order ARMA type recursive filter with guaranteed stability and convergence is provided together with a method for obtaining the parameters of such filter. The amplitude/frequency response of the filter approximates an arbitrarily selected frequency spectrum of amplitude, and the phase response approximates a substantially linear function of frequency with an arbitrarily selected slope because the parameters are identified, off-line, using a minimization process that minimizes an integral error norm. The first step involves performing an inverse discrete Fourier transform of the arbitrarily selected frequency spectrum of amplitude to obtain a truncated sequence of coefficients of a stable, pure moving-average filter model, i.e., the parameters of a non-recursive filter model. The truncated sequence of coefficients, which has N+1 terms, is then convolved with a random sequence to obtain an output sequence associated with the random sequence. A time-domain, convergent parameter identification is then performed, in a manner that minimizes an integral error function norm, to obtain the near minimum order parameters $\alpha_i$ and $\beta_j$ of the model having the desired amplitude- and phase-frequency responses, the parameters satisfying the relationship:

$$\sum_{i=0}^{n} \alpha_i y_{k-i} = \sum_{j=0}^{m} \beta_j u_{k-j+v}$$

where: $\alpha_i$ is the ith auto-regressive parameter, and $\beta_j$ is the jth moving-average parameter, respectively, of an ARMA-type recursive filter; n and m denote the order of the auto-regressive and the moving-average parts of the ARMA model, respectively; $y_k$ and $u_k$ are associated elements of the kth element of the output sequence and the random sequence, respectively; k is an integer; and v is a shift integer selected to provide the desired slope of the phase response given by $2\pi(v-N/2)$.

18 Claims, 13 Drawing Figures

ARMA FILTER AND METHOD FOR DESIGNING THE SAME

This is a division of application Ser. No. 660,513 filed Feb. 23, 1976.

CROSS-REFERENCES TO RELATED PRIOR ART

The following references, helpful to an understanding of the present invention, are hereby incorporated by reference:

[1] Rader, C. M. and Gold, B.: "Digital Filter Design Techniques in the Frequency Domain", Proc. IEEE, Vol. 55, February, 1967

[2] Helms, H. D.: "Non-Recursive Digital Filters—Design Methods for Achieving Specifications on Frequency Response", IEEE Trans. on Audio and Electroacoustics, Vol. AU-16, September, 1968

[3] Farden, D. C. and Scharf, L. L.: "Statistical Design of Nonrecrusive Digital Filters", IEEE Trans. on Acoustics, Speech and Signal Processing, June, 1974

[4] Brophy, F. and Salazar, A. C.: "Synthesis of Spectrum Shaping Digital Filters of Recursive Design", IEEE Trans. on Circuits and Systems, March, 1975

[5] Rabiner, R. and Gold, B.: "Theory and Application of Digital Signal Processing", Prentice Hall, Inc., Englewood Cliffs, N.J., 1975

[6] Spiegel, M. R.: "Real Variables", McGraw-Hill (Schaum), New York City, 1969

[7] Graupe, D.: "Identification of Systems", 2nd Edition, R. E. Krieger Publishing Co., Huntington, New York, 1976

[8] Graupe, D., Krause, D. J., and Moore, J. B.: "Identification of Autoregressive Moving-Average Parameters of Time Series", IEEE Trans. on Automatic Control, Vol. AC-20, February, 1975

[9] Kou, B. C.: "Automatic Control Systems", Prentice Hall, Englewood Cliffs, N.J., 1975

[10] Jiri Vlach: "Computerized Approximation and Synthesis", John Wiley & Sons, New York City, 1969

BACKGROUND OF THE INVENTION

This invention relates to electrical filters, and to methods of designing the same. More particularly, the invention relates to compensatory filters for hearing aids, and to the design of such filters.

From an examination of an aurally handicapped person, an audiologist can prepare an audiogram which is a plot of the threshold of aural acuity for pure tones in the most significant portion of the speech band of frequencies, say from 250–8000 Hz. Using the audiogram, the audiologist can prepare a frequency spectrum, unique to a patient, for specifying the compensatory amplification that a hearing aid must provide in order to overcome or at least minimize the patient's hearing deficiencies. Since deficiencies in aural acuity vary from patient to patient, and indeed, over time with the same patient, it is obvious that a wide variety of frequency spectrums exist for which hearing aids must provide compensation.

While there are many different types of hearing aids on the market, each with its own frequency spectrum characteristic, and while some minor alteration in frequency response can be achieved in a given hearing aid system to adapt it to a particular patient, the available frequency characteristics cannot possibly match the diverse characteristics required by aurally handicapped persons. Consequently, it is highly unlikely that a given hearing aid will provide perfect compensatory amplification for a given patient. In general, only partial compensation can be achieved, and the audiologist is forced to select a hearing aid which provides, in his judgement, the best compromise between what the patient requires and what the hearing aid will provide.

In order to provide improved compensatory amplification, it has been suggested to incorporate into a hearing aid, a compensatory filter whose frequency response characteristics will modify the frequency response of the instrument such that it provides amplification only at those frequencies at which acuity is deficient, and only in the amount deemed desirable for the patient being treated with the hearing aid. In order to be applicable to any patient regardless of where his particular hearing loss occurs, the filter must be capable of being designed to have a response over a band of frequencies closely matching an arbitrarily selected frequency spectrum. The parameters of the filter should also have the capability of being adjusted to modify the frequency characteristics of the filter in order to match changes in aural acuity of the user. In addition, such filter must be stable and must not introduce undesirable phase shift characteristics into the system, otherwise the hearing aid will not be able to amplify speech intelligibly notwithstanding the spectrum matching ability of the filter.

Discrete-time filters, known in the art as finite duration impulse response (FIR) filters or discrete impulse response (DIR) filters, can emphasize or suppress arbitrary frequencies within a given range of frequencies in a continuous waveform input. In theory, such filters would be ideally suited for on-line incorporation into a hearing aid, but in the form heretofore known, they have practical problems that militate against their use.

In its non-recursive form, an on-line discrete-time filter operates on a continuous waveform by multiplying present and past samples of the waveform by selected factors (i.e., the parameters of the filter), and arithmetically combines the result to produce, in real-time, a filtered waveform. In its recursive form, the filter performs a discrete convolution of previously computed values of the output waveform (i.e., the filtered waveform), and adds to this the discrete convolution of the input waveform (i.e., the original unfiltered waveform). The factors by which the past and present samples of the output waveform are multiplied are termed the auto-regressive parameters of the filter, and the factors by which the past and present samples of the original unfiltered waveform are multiplied are termed the moving-average parameters of the filter. As a consequence of this terminology, a filter of the type referred to above is termed an auto-regressive-moving-average (ARMA) type filter.

In general, the total number of the auto-regressive and moving-average parameters of an ARMA filter designed to match an arbitrarily selected frequency spectrum over a predetermined range of frequencies will be less than the number of parameters of a non-recursive filter designed for equal matching of the same frequency spectrum. See Reference [7], pgs. 216–218, and Reference [8].

One problem with incorporating conventional discrete-time filters into hearing aids is the size, weight and cost of these filters because of the number of parameters involved. Often, the number of parameters run into the hundreds as indicated in References [2] and [3]. A hardward implementation of such a filter requires the use of microprocessors and related microelectronic digital data-processing hardware, or microelectronic solid state tapped analog delay chips (TAD), depending upon whether the filter is entirely digital, entirely discrete-time-analog, or a hybrid combination of both. A non-recursive filter, or even a conventionally designed ARMA filter, whose number of parameters is not close to minimum, thus requires substantial hardware for implementation. This makes adjustment cumbersome. Furthermore, the filter becomes too expensive for a mass market such as that for hearing aids, and so heavy and bulky, when incorporated into a hearing aid, that the latter cannot be worn easily and comfortably.

Another problem with conventionally designed ARMA filters is the undesirable phase shift introduced by the filter, a factor of critical importance in a hearing aid where speech intelligibility depends on the phase as well as the amplitude characteristics of the frequency response of the filter. This problem has arisen because of concentration in the prior art on frequency domain optimization as indicated in Reference [4], with stability being achieved after optimization by shifting unstable poles of the filter to the stable region of the complex plane. Thus, there can be no guarantee that a conventionally designed ARMA filter, with an optimized amplitude-frequency spectrum characteristic, will have zero phase shift or a linear phase shift of arbitrary slope. In the absense of zero phase shift, or a linear relationship between phase and frequency, speech intelligibility can be reduced significantly even if compensatory amplitude/frequency spectrum fitting is achieved. Where phase proves to be a problem, the conventional approach is to increase (in fact, double) the number of parameters which increases the cost, weight and expense as indicated above.

Reference [5] suggests a time-domain design in which parameters are fitted directly to the impulse response function, but this approach cannot guarantee a stable, minimum parameter realization with a phase shift of zero or linear slope.

It is therefore an object of the present invention to provide a new and improved ARMA filter and a method for designing the same, wherein the filter overcomes or substantially avoids the deficiencies of the prior art as set forth above. Specifically, it is an object of the present invention to provide a minimum, or near minimum order, stable, ARMA filter whose amplitude frequency response closely matches an arbitrarily selected amplitude frequency spectrum, and whose phase response is zero or varies linearly with frequency at an arbitrarily selected slope.

SUMMARY OF THE INVENTION

The present invention provides a near minimum order ARMA type recursive filter with guaranteed stability and convergence, and a method for obtaining the parameters of such filter. The amplitude/frequency response of the filter approximates an arbitrarily selected frequency spectrum of amplitude, and the phase response approximates a substantially linear function of frequency with an arbitrarily selected slope because the parameters are identified, off-line using a minimization process that minimizes an integral error norm. The first step involves performing an inverse discrete Fourier transform of the arbitrarily selected frequency spectrum of amplitude to obtain a truncated sequence of coefficients of a stable, pure moving-average filter model, i.e., the parameters of a non-recursive filter model. The truncated sequence of coefficients, which has N+1 terms, is then convolved with a random sequence. A time-domain, convergent parameter identification is then performed in a manner that minimizes an integral error function norm, as, for example, by minimizing an $L^p$ norm (see Reference [6], pg. 115, for a definition of $L^p$ function space) to obtain the near minimum order parameters $\alpha i$ and $\beta j$ of a model having the desired amplitude-and-phase-frequency responses, which parameters satisfy the relationship:

$$\sum_{i=0}^{n} \alpha_i y_{k-i} = \sum_{j=0}^{m} \beta_j u_{k-j+v}$$

where: $\alpha i$ is the ith auto-regressive parameter, and $\beta j$ is the jth moving-average parameter, respectively, of an ARMA-type recursive filter; n and m denote the order of the auto-regressive and the moving-average part of the ARMA model, respectively; $y_k$ and $u_k$ are associated elements of the kth element of the output sequence and the random sequence, respectively; k is an integer; and v is a shift integer selected to provide the desired slope of the phase response given by $2\pi(v-N/2)$.

The present method, by employing convergent off-line parameter optimization of an integal error function norm, and by using stable input and output data sequences of any desired length, must inherently converge to a stable model. The minimum order feature can be achieved iteratively through checking functions of the model error, or the similar order determination methods. Once a minimum or near minimum order is achieved, convergence to a minimum or near minimum order stable model is guaranteed. The linear slope phase shift characteristics, which includes the possibility of zero phase shift, are achieved in the present method because zero phase shift or linear phase shift non-recursive models are used to produce the output data employed for parameter identification.

BRIEF DESCRIPTION OF THE DRAWINGS

Embodiments of the present invention are illustrated in the accompanying drawings wherein.

DETAILED DESCRIPTION

Figure 1:
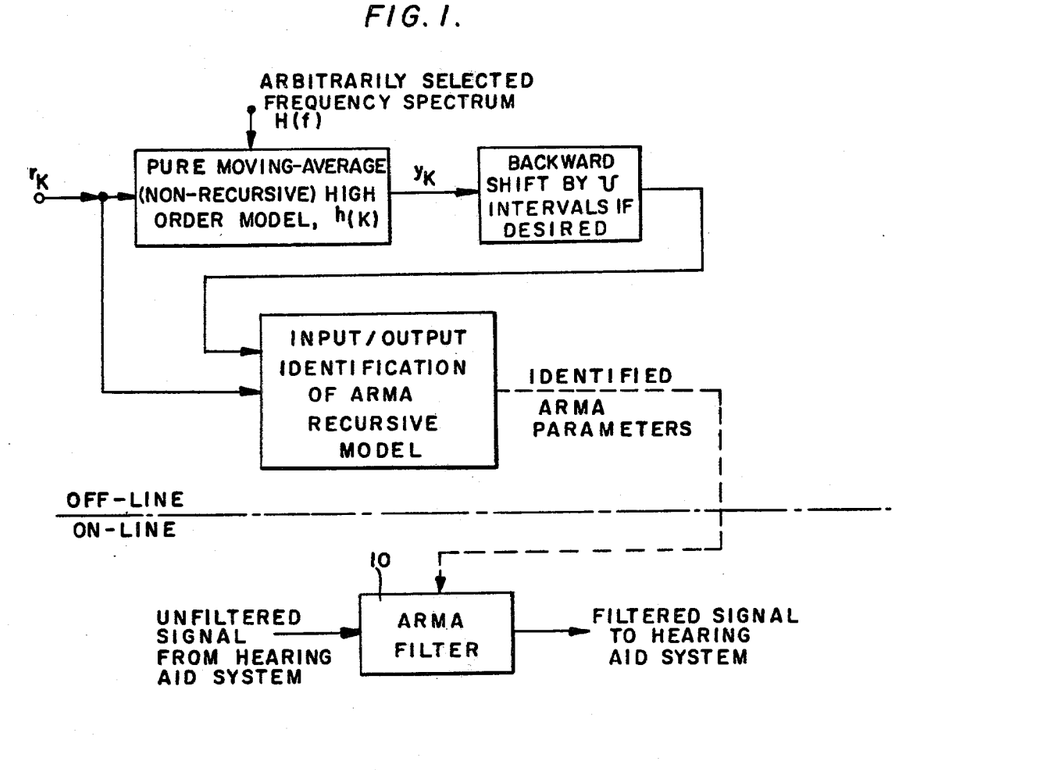
FIG. 1 is a composite block diagram showing the basic method for identifying the ARMA type parameters in an off-line process utilizing an arbitrarily selected frequency spectrum, and showing an on-line, minimum, or near minimum, order stable ARMA filter into which such parameters are incorporated, the amplitude frequency response of the filter matching the arbitrarily selected spectrum, and the phase frequency response of the filter being zero or having a linear slope.

Referring now to FIG. 1, reference numeral 10 designates an on-line ARMA type recursive filter whose frequency response closely approximates an arbitrarily selected frequency spectrum H(f) utilized in the off-line design of the filter described below. The spectrum H(f) can be any arbitrarily selected spectrum, and may be, by way of example, a spectrum determined by an audiologist involved in fitting a hearing aid that provides compensatory amplification for an aurally handicapped person. Alternatively, H(f) can be a spectrum that increases sharply in the upper frequency range of speech when the filter is to be used for enhancing speech in a communication system.

The off-line design procedure is basically a batch manipulation of an input data sequence of finite length based on a finite observation time. One design procedure is shown in block diagram form in FIG. 2, although other procedures are possible. Reference numeral 12 designates an arbitrarily selected frequency spectrum. A discrete, inverse Fourier transform of spectrum 12 is carried out yielding a finite sequence of coefficients a designated by the lines 14. The height of a line represents the value of a coefficient. The procedure or program for carrying out a discrete inverse Fourier transform of an arbitrarily selected frequency spectrum is well known in the art, and is disclosed in detail in Reference [5].

Figure 2:
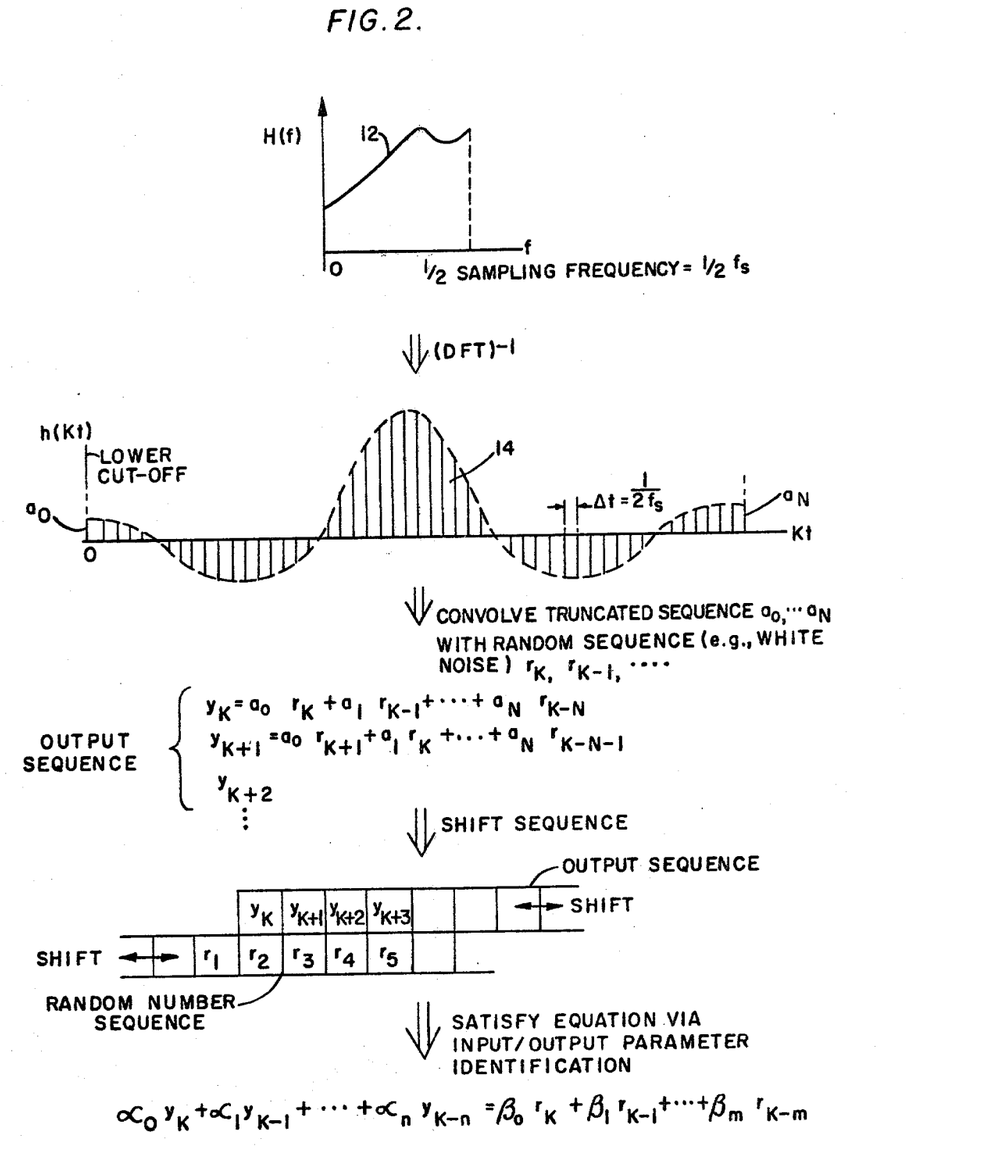
FIG. 2 is a flow chart showing a typical off-line batch manipulation for obtaining the ARMA model parameters.

The finite sequence of coefficients is in truncated form whenever a discrete inverse Fourier transform is carried out since this transform yields a finite number of parameters. It can be truncated further by selecting upper and lower cut-off times from which, onwards, the absolute value of a coefficient bears a predetermined fractional relationship to the absolute value of the peak coefficient in the truncated sequence. For example, truncation can be achieved by eliminating all coefficients beyond the coefficient with a value of, say, 5% of the coefficient having the peak value in the truncated sequence. Other techniques are available to form the truncated sequence which is, in fact, a moving-average-type sequence. As used hereinafter, the term "truncated sequence" means the sequence resulting from carrying out a discrete inverse Fourier transform, or the sequence resulting from further truncation.

The truncated sequence of coefficients defines the parameters of a stable, pure moving-average type filter model, i.e., the parameters of a non-recursive filter model, having a linear phase shift $\theta$ given by:

$$\theta = -N\pi f$$

where; N+1 is the total number of coefficients of the truncated sequence and f is frequency in Hz. See Reference [5], section 3.4. Thus, the slope of the phase shift is negative and has the value: $N\pi$.

In a known manner, the truncated sequence is convolved with a random sequence which may be truly random (i.e., white noise), or pseudo random (i.e., computer generated). Both types of sequences, for convenience, are referred to hereinafter as "random" sequences. Reference [7], section 4.2, contains information on specific methods by which the required random sequence can be generated by a computer.

The procedure for performing the convolution is described in Reference [7], section 4.1, and Reference [5], pg. 15. The convolution yields the output sequence $y_k$, whose kth element is given by:

$$y_k = a_0 r_k + a_1 r_{k-1} + \ldots + a_N r_{k-N}$$

where: $a_0$ and $a_N$ are the first and last coefficients respectively of the truncated sequence of coefficients having N+1 terms, k is an integer; $r_{k-N}$ is the (k−N)th random number, and $r_k$ is the kth random number. The (k+1)th element of the output sequence is:

$$y_{k+1} = a_0 r_{k+1} + a_1 r_k + \ldots + a_N r_{k-N-1}$$

From convergence considerations, the number of values of k (i.e., the number of samples or terms of the output sequence) should be much larger than the total number of parameters to be determined in the manner described below. It is preferred for k to start at N, but results of adequate accuracy for some applications may be obtained by starting k at a number much less than N.

It is necessary to shift the elements of the output sequence relative to the elements of the random sequence backwards in time by v places to arrive at the desired slope for the linear phase shift $\theta$ given by:

$$\theta = (v - N/2) 2\pi f$$

where: N and f are defined above. The slope of the phase shift, $2\pi(v-N/2)$, can be adjusted to an arbitrarily selected value, including zero, by the proper selection of the integer v which establishes the number of places the output sequence is shifted relative to the elements of the random sequence. As used herein, the term "arbitrarily selected slope" includes a slope of zero corresponding to zero phase shift.

A time-domain, convergent parameter identification is then performed using an identification algorithm that minimizes an integral error function norm, the algorithm being in the form of algorithms given in Reference [7], Chapters 5–9 and 12, and in other publications on identification. The preferred convergent identification algorithms are those that minimize an $L^p$ norm with p=2; and the best known algorithms of this type are the least-squares algorithms which are described in Reference [7], Chapters 5 and 6.

As a consequence of using the desired identification algorithm, there is obtained the near minimum order parameters αi and βj of the ARMA model given by the relationship:

$$\sum_{i=0}^{n} \alpha_i y_{k-i} = \sum_{j=0}^{m} \beta_j u_{k-j+v}$$

where: αi is the ith auto-regressive parameter, and βj is the jth moving-average parameter, respectively, of an ARMA type recursive filter; n and m denote the order of the auto-regressive and the moving-average part of the ARMA model respectively; $y_k$ and $u_k$ are associated elements of the kth element of the output sequence and the random sequence, respectively; and k and v are defined above.

The minimum order feature may be obtained iteratively through checking functions of the model error, such as the square of the error versus the order, or by other order determination methods such as disclosed in Reference [8].

Figure 3:
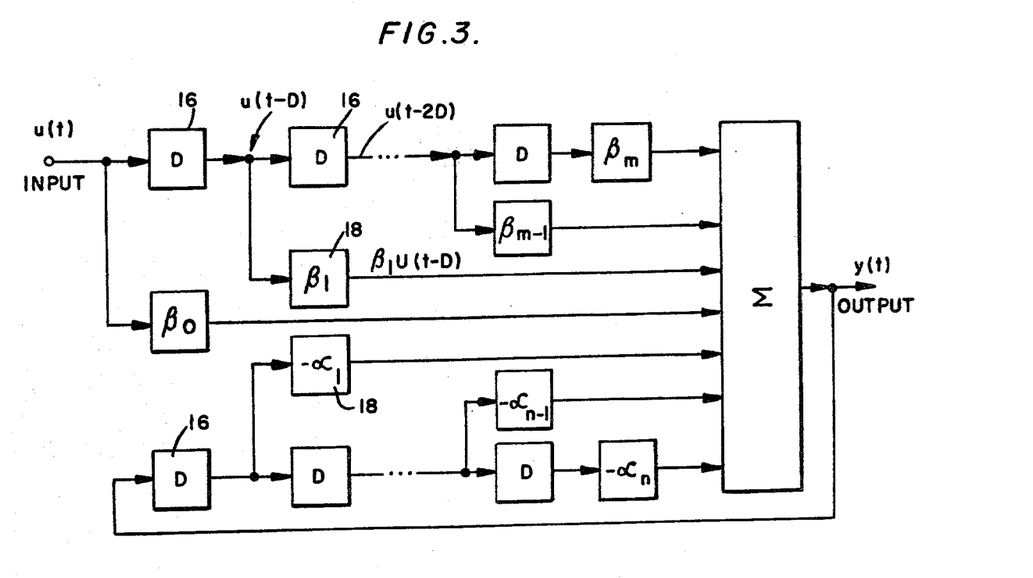
FIG. 3 is a block diagram of a typical ARMA filter.

Once the ARMA filter parameters are available via identification, the filter, which is shown schematically in FIG. 3, can be realized by a compact microprocessor and related microelectronics digital data processing hardware, or by microelectronics, solid-state analog delay chips, such as the discrete tapped analog delay (TAD) hardware. Both approaches can meet most speed, cost, weight and volume requirements relative to hearing aid applications. The microprocessor realization is a completely digital method requiring the incorporation of analog-to-digital converter chips, whereas the TAD approach is a discrete-time but otherwise mostly analog method. The latter approach has the advantage of eliminating the need for analog-to-digital conversion hardware, but has the disadvantage, unless a microprocessor is incorporated for performing the multiplications by the ARMA coefficients αi and βj and the subsequent additions, that the parameter setting of the coefficients is made by potentiometer settings that are subject to drift and to mishandling by the user, and that are relatively inaccurate and relatively bulky.

In FIG. 3, reference numeral 16 designates a typical electronic box whose output is a reproduction of the input but delayed a finite time D. This result can be achieved by TAD hardware, or by a microprocessor. Reference numeral 18 designates an electronic box whose output is the input to the box multiplied by the factor appearing in the block. Note that FIG. 3 represents the equation:

$$\frac{y_k}{u_k} = \frac{\beta_0 + \beta_1 D + \ldots + \beta_m D^m}{1 + \alpha_1 D + \ldots + \alpha_n D^n}$$

where: D is a delay operator that operates on either the output $y_k$ or the input $u_k$, where $Dy_k = y_{k-1}$; $y_k$ and $u_k$ being defined above.

The required multiplication can be by way of analog computation. In such case, box 18 would include a potentiometer whose setting is the value of a parameter. On the other hand, multiplication can be by way of digital computation, and in such case the function of box 18 would be achieved by a microprocessor programmed to utilize the contents of a memory wherein the parameters are stored as entries.

Figure 4A:
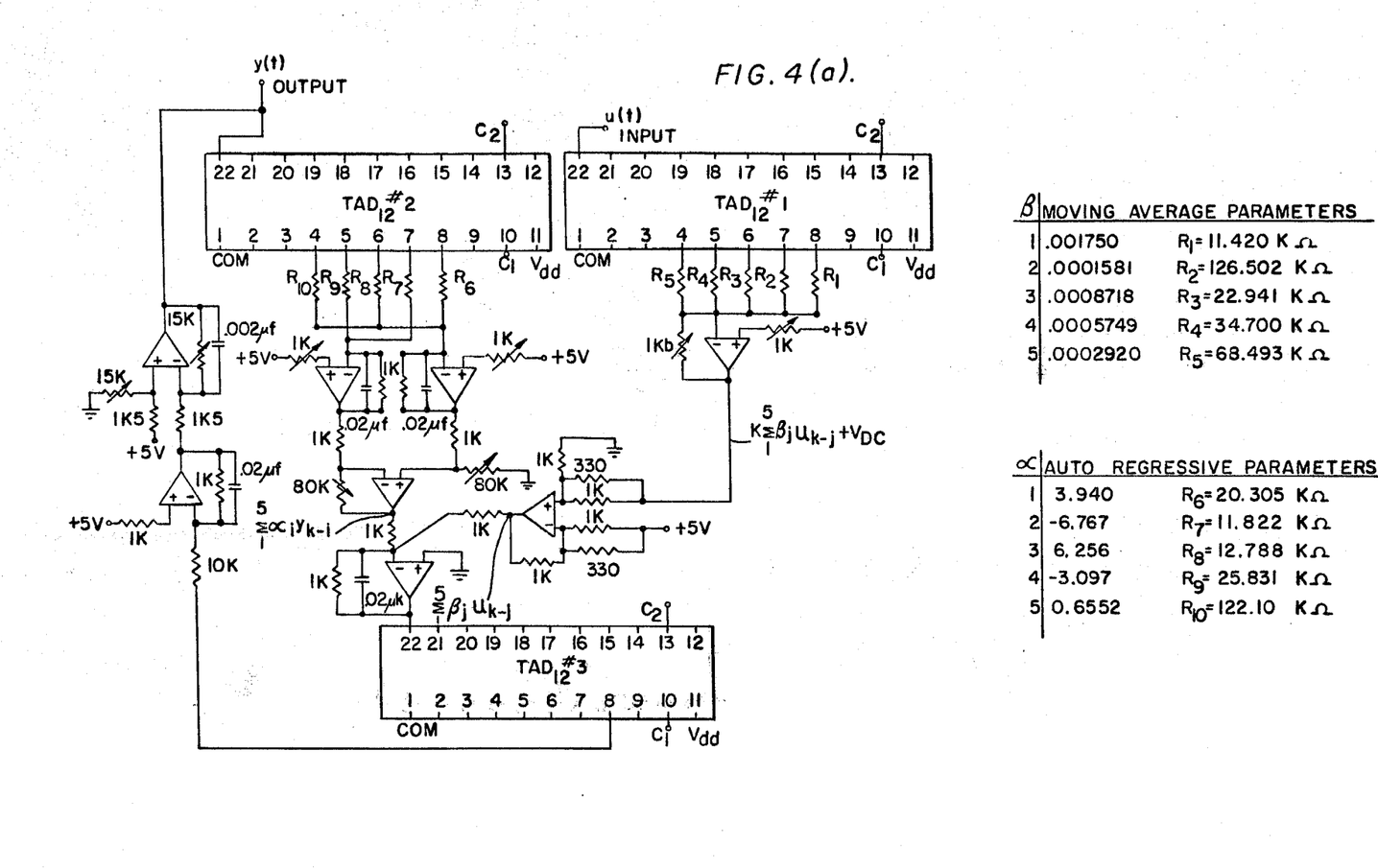
FIG. 4(a) is a circuit diagram of an ARMA filter designed according to the flow chart of FIG. 2.
Figure 4B:
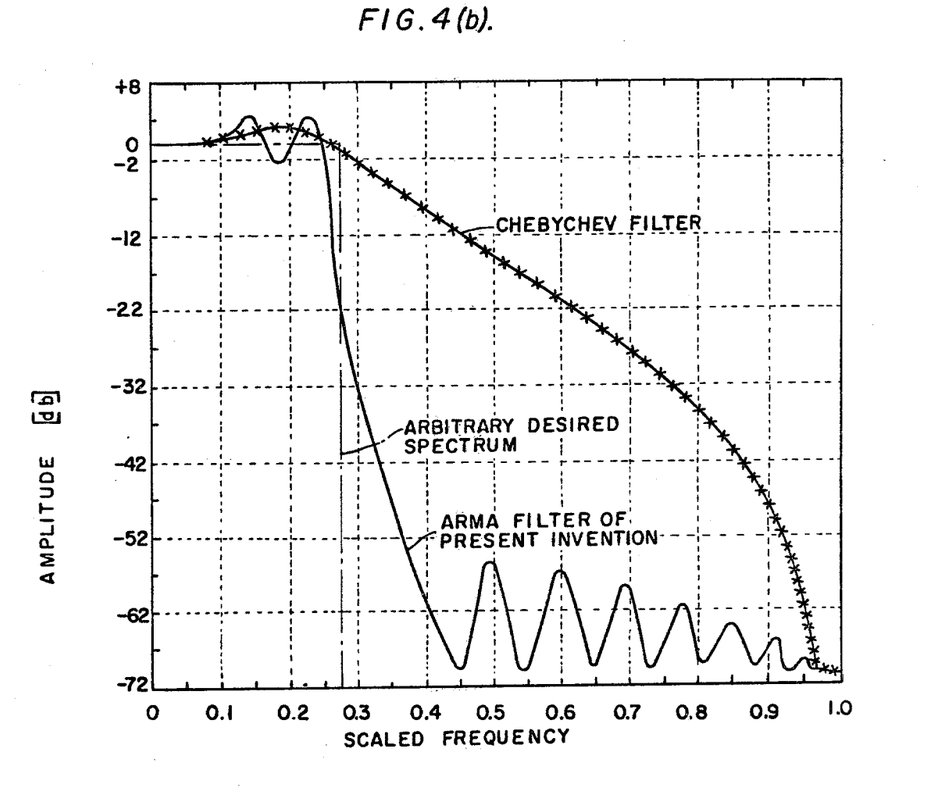
FIG. 4(b) shows the actual spectrum achieved by the ARMA filter of FIG. 4(a) superimposed on a specific desired spectrum of the filter used as H(f) in the flow chart of FIG. 2, and compared with the spectrum of a Chebychev type ARMA filter of the same order.

An actual circuit designed in accordance with the flow chart of FIG. 2 is shown in FIG. 4(a) wherein the design spectrum H(f) and the actual spectrum achieved are shown in FIG. 4(b). In designing the circuit of FIG. 4(a), the moving-average parameters, h(k), were obtained using a computer program for performing an inverse discrete Fourier transform of the arbitrarily selected spectrum H(f). Such a program is disclosed in Reference [5], pgs. 367, 371. A 30 kHz sampling rate was used. In operating the circuit of FIG. 4(a), the analog and digital power supplies were separate to reduce noise. The clock frequency was 60 kHz, and the clock input C1 is the complement of clock input C2. The non-used taps of the tapped analog delay were returned to +5VDC via a 15 Kohm resistor. The taps marked "Com" and "Vdd" were connected to +5VDC and −10VDC respectively. Superimposed on the curves shown in FIG. 4(b) is a Chebychev filter of ARMA form having the same order as the filter of FIG. 4(a). The Chebychev filter is the discrete version of the filter described in Reference [10], pg. 261 formed by using a bilinear Z-transform that results in an ARMA-model with five auto-regressive and five moving-average parameters.

In actually fitting a hearing aid to a patient, the audiologist would select the appropriate spectrum for providing compensatory spectrum adjustment and would write the parameters of this spectrum, preferably in terms of gain values and possibly phase values at various frequencies onto a specified input card or tape. This provides the input to the batch filter program, like that described above, in an input/output identification preprogrammed algorithm package whereby the ARMA type parameters equivalent to the selected batch filter are identified. He will then use the output of the identification program, which is the set of the required ARMA parameters, to adjust the parameters of the sequential ARMA type filter.

The facility with which parameter adjustment can be carried out in the filter of the present invention makes its incorporation into a hearing aid even more attractive. Physiological changes in a patient may require a modification of the filter parameters as determined by an audiologist subsequent to the initial fitting of the hearing aid. On the other hand, aging of components of the hearing aid may change the overall spectrum of the system requiring adjustment to the filter parameters in order to return the response to its original state. In the filter of the present invention, parameter adjustment requires no change of components. If the filter is in the form shown in FIG. 4(a), where the parameters are determined by potentiometer settings, parameter adjustment is carried out by properly changing the settings. If the filter utilizes a microprocessor instead of resistances or potentiometers, proper changes in the contents of the memory storing the ARMA parameters will effect the required change in the values of the parameters.

An ARMA filter designed according to the present invention to provide compensatory spectrum fitting can be incorporated into a hearing aid in the alternative arrangements shown in FIG. 5. Basically, a hearing aid comprises a microphone for receiving input sound and converting the input sound to electrical signals, an amplifier for amplifying the signals, and a speaker for converting the amplified electrical signals into output sound. A hearing aid will have a predetermined frequency response dependent on the various components and the manner in which the speaker is coupled to the user's ear; and generally, there will be a mis-match between what the hearing aid provides to the user and what is required by the user, hence the need for compensatory spectrum fitting which is achieved by coupling into the hearing aid, an ARMA filter whose design criteria was based on an autiologist's study of the patient.

Figure 5A:
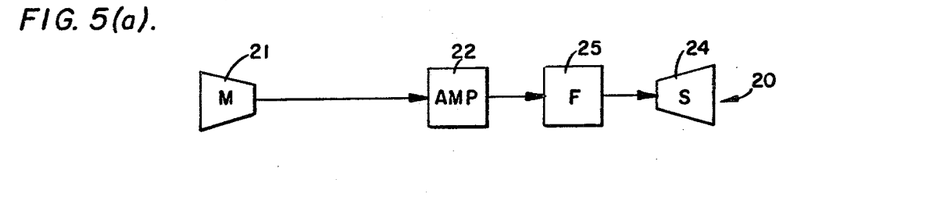
FIGS. 5(a) and (b) are block diagrams of hearing aid systems into which the filter of FIG. 2 is coupled at various locations within the system.
Figure 5B:
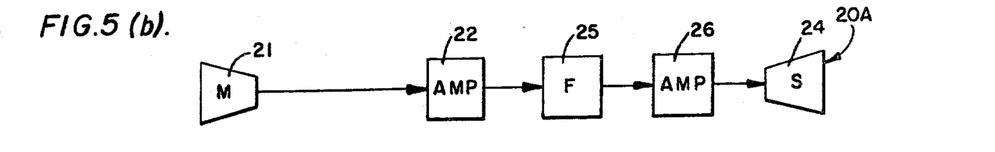
Figure 6A:
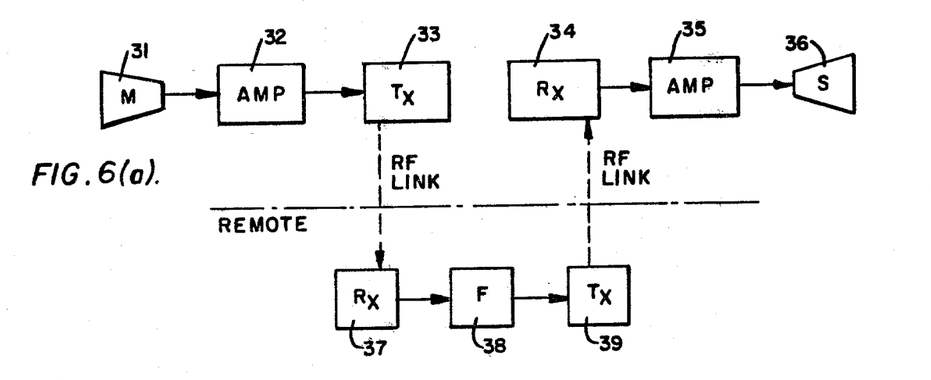
FIG. 6(a) is a block diagram of a hearing aid system using the filter of FIG. 2 at a remote location, but coupled by a wireless (i.e., RF) link to the remainder of the system.

As shown in FIG. 5(a), hearing aid system 20 includes the usual microphone 21, amplifier 22, and speaker 24; and filter 25, designed in accordance with the present invention, is interposed between amplifier 22 and speaker 24. In system 20A shown in FIG. 5(b), an extra amplifier 26 could be used with filter 25 interposed between amplifiers 22 and 26. From the above, it can be appreciated that the location of the filter in the hearing aid is not critical.

Where the bulk of the hearing aid will not admit of the physical inclusion of the filter according to the present invention with other components of the hearing aid, the arrangement shown in FIG. 6 can be employed. In system 30, the filter is remote from the other components and is coupled thereto by a wireless radio link. System 30 thus includes microphone 31, amplifier 32, whose output modulates transmitter 33, and receiver 34 driving amplifier 36 which in turn drives speaker 36. The modulated RF signal from transmitter 33 is picked up at a remote location, for example, in a power pack worn on the person of the user, by receiver 37 which demodulates the signal and converts the same to an audio signal that is applied to filter 38 constructed according to the present invention. The filtered output modulates transmitter 39 whose signal is picked up by receiver 34 which demodulates the signal and drives amplifier 35. The amplified signal is fed to speaker 36 of the hearing aid.

Figure 6B:
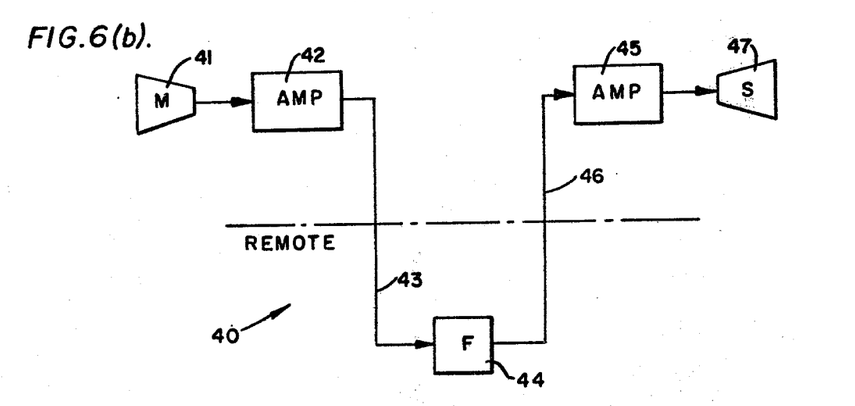
FIG. 6(b) is similar to FIG. 6(a) but showing the filter coupled by wires to the system.

In system 40, shown in FIG. 6(b), the remote filter is coupled to the hearing aid components by wires. System 40 thus includes microphone 41 driving amplifier 42 which is connected by wires 43 to a remote filter 44 constructed according to the present invention. The output of filter 44 is applied to amplifier 45 by wires 46. Amplifier 45 drives speaker 47.

As is well known in the hearing aid art, each instrument has associated with it the capability of oscillation when some of the output of the speaker is fed back acoustically into the microphone. This situation is illustrated in block diagram form in FIG. 7 where reference numeral 50 designates a hearing aid having a filter coupled thereto for providing compensatory spectrum fitting in accordance with the present invention. A frequency-dependent feedback loop is designated 51; and it is well known that oscillation occurs when a dominant frequency is present in the input to the system.

Figure 7:
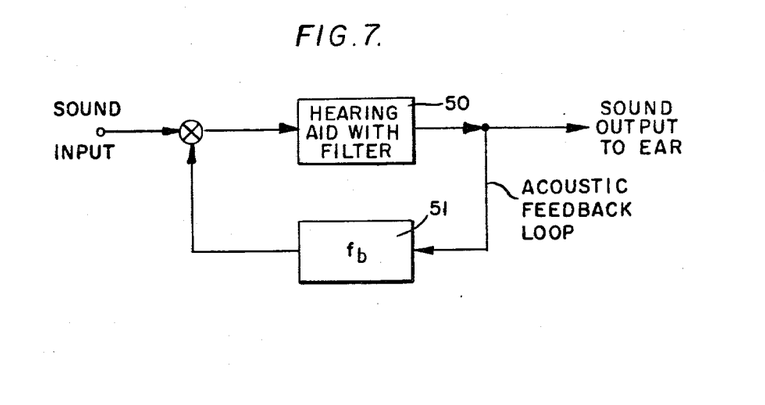
FIG. 7 is a block diagram illustrating the equivalent block diagram of a hearing aid system applied to a patient when a feedback path exists between the input and output of the system.
Figure 8:
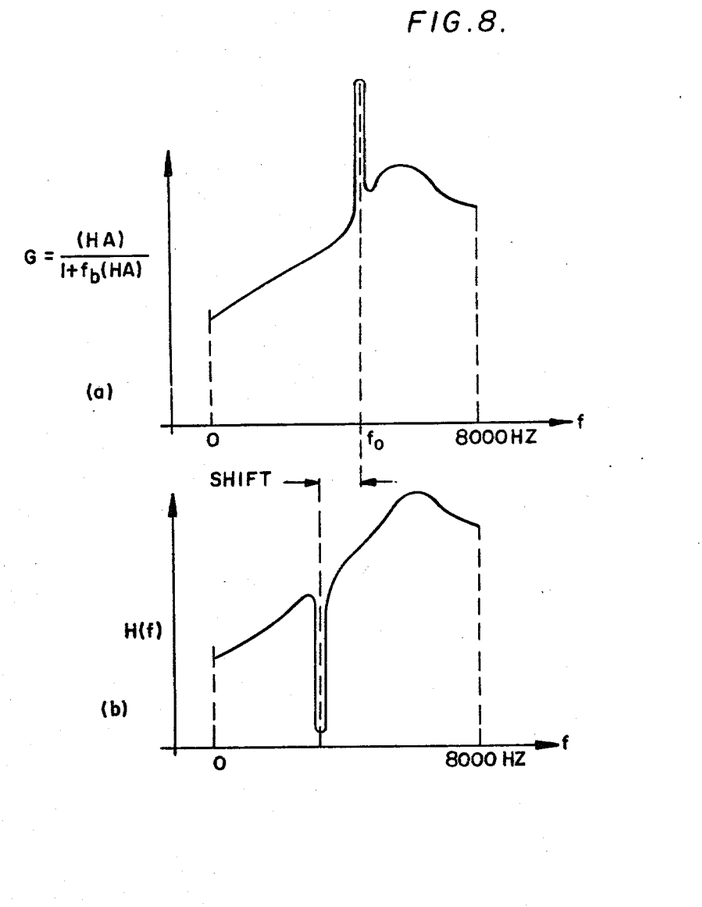
FIG. 8(a) shows the overall frequency response of the system in FIG. 7 and showing the frequency at which feedback squeal will occur in the patient's ear.
FIG. 8(b) is the frequency response of a compensating filter having a shifted notch located to cancel the feedback peak.

The instability of the system of FIG. 7 is illustrated by the curve of FIG. 8(a), which shows the gain of the system as a function of frequency, the curve being merely illustrative of typical responses. As can be seen, the presence of a signal at frequency $f_o$ will result in a very high gain, and the hearing aid will oscillate rendering it totally unusable. According to the present invention, this situation can be remedied by a modification of the spectrum designed into the filter.

When acoustic feedback is present, the response of the hearing aid system takes the feedback into account as part of a closed loop. If the closed loop spectrum is designated G, then $$G = \frac{(HA)}{1 + f_b(HA)}$$

where: (HA) is the open loop transfer function in a delay operator D of the hearing aid, and $f_b$ is a transfer function in D of the acoustic feedback, D being a one interval back-shift operator. In general, $f_b$ is known in that it can be determined in an audiological laboratory via an identification method such as given in Reference [7], but the determination of $f_b$ is not part of the present invention.

Having determined $f_b$, and knowing G from actual tests, then the open loop spectrum (HA) can be calculated in accordance with Reference [9], Chapters 6 and 7, to yield a stable G to overcome the oscillation. Since the hearing aid without its compensatory filter will usually have a spectrum different from (HA) as required by the patient, the filter of the present invention will be designed to match the difference. The result may be the spectrum H(f) shown in FIG. 8(b) for the filter. It is emphasized that the spectra shown in FIGS. 8(a) and 8(b) are illustrative of the general principles involved, and in fact, the spectra may have many different shapes.

The ability of the present invention to provide a filter of arbitrarily selected frequency responses, permits the filter of the invention to provide for speech enhancement in a communication system in a high noise environment. Since most environmental noise has energy in the low frequencies, and since the intelligence in speech has a band in the frequency range from 2 to 8 kHz, a filter having the characteristics shown in FIG. 9(b) would exclude most noise, thus enhancing speech intelligibility.

Figure 9A:
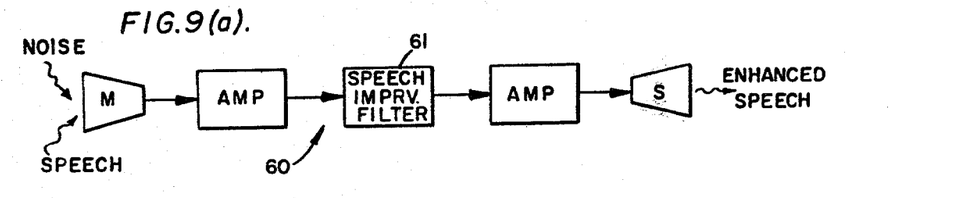
FIG. 9(a) is a block diagram of a specific speech communication system for enhancing speech intelligibility.
Figure 9B:
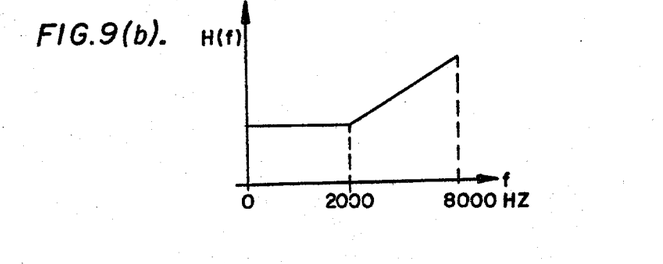
FIG. 9(b) is a typical response of the filter used in the system of FIG. 9(a).

A communication system for enhancing speech intelligibility as shown at 60 in block diagram form in FIG. 9(a), and compromises the same components as the hearing aids shown in FIG. 5. In this case, however, filter 61 would have a response like that shown in FIG. 9(b). Such response would be flat to about 2 kHz and then increase linearly to 8 kHz. Responses having other shapes, such as would provide very low amplification for the low frequencies, also would be satisfactory, the idea being to apply a greater gain to that portion of the speech spectrum containing most of the intelligence.

It is believed that the advantages and improved results furnished by the ARMA filter of the present invention, and by the method of designing the same, are apparent from the foregoing description of the several preferred embodiments of the invention. Various changes and modifications may be made without departing from the spirit and scope of the invention as sought to be defined in the claims that follow.

What is claimed is:

1. A stable digital filter whose amplitude-frequency response approximates an arbitrarily selected frequency spectrum of amplitude, whose total number of parameters m+n+1 is near-minimum, and whose phase response approximates a substantially linear function of frequency with an arbitrarily selected slope, comprising:

(a) an input terminal and output terminal;

(b) m+1 gain parameters $\beta_0, \beta_1, \ldots \beta_m$ associated with the input terminal;

(c) n gain parameters $\alpha_1, \alpha_2, \ldots \alpha_n$ associated with the output terminal;

(d) means connecting the input and output terminals with the gain parameters such that $$\frac{y(t)}{u(t)} = \frac{\beta_0 + \beta_1 D + \ldots + \beta_m D^m}{1 + \alpha_1 D + \ldots + \alpha_n D^n}$$

where D is a delay operator operating on the filter's output and input signals y(t) and u(t), respectively, such that $Dy(t)=y(t-D)$, etc.;

(e) the gain parameters satisfying the relationship $$\sum_{i=0}^{n} \alpha_i y_{k-i} = \sum_{j=0}^{m} \beta_j r_{k-j+v}$$

where $n=0,1,2,\ldots$; $m=0,1,2,\ldots$; k is an integer; v is an integer determining the slope of the phase shift versus frequency response of the filter; and $y_k$ and $r_k$ are the kth elements of an output sequence and a random sequence, respectively, the output sequence being the sequence obtained by convolving a truncated sequence of coefficients with the random sequence, the truncated sequence being a sequence obtained by truncating the sequence of coefficients resulting from performing an inverse Fourier transform on said arbitrarily selected frequency spectrum.

2. A hearing aid comprising the filter of claim 1 in combination with a microphone for receiving input sound and converting the input sound to electrical signals, an amplifier for amplifying the signals, and a speaker for converting the amplified signals into output sound, the filter being coupled to the combination for modifying the electrical signals.

3. A hearing aid according to claim 2 wherein the filter is interposed between the amplifier and the speaker.

4. A hearing aid according to claim 2 wherein the filter follows the amplifier, and including an additional amplifier interposed between the filter and the speaker.

5. A hearing aid according to claim 2 wherein the filter is proximate to the other components of the hearing aid.

6. A hearing aid according to claim 2 wherein the filter is remote from the other components of the hearing aid.

7. A hearing aid according to claim 6 wherein the coupling between the filter and the combination is an RF link.

8. A hearing aid according to claim 6 wherein the coupling between the filter and the combination includes a wire.

9. A hearing aid according to claim 2 wherein the filter provides compensation for acoustic feedback.

10. A hearing aid according to claim 2 wherein the delay operator is realized by a tapped analog delay line.

11. A hearing aid according to claim 10 wherein the parameters are realized by input resistances to summing amplifiers.

12. A hearing aid according to claim 11 wherein the input resistances are potentiometers.

13. A speech communication system comprising the filter of claim 1 in combination with a microphone for introducing input sound into the system, circuitry for converting the sound into electrical signals, and a speaker responsive to electrical signals for converting the same into output sound, the filter being designed to accentuate frequencies at the upper end of the speech spectrum whereby speech intelligibility is enhanced.

14. A filter according to claim 1 wherein $n=0$.

15. A filter according to claim 1 wherein $m=0$.

16. A hearing aid comprising:
   (a) the combination of:
      (1) a microphone for receiving input sound and converting the sound into electrical signals;
      (2) an amplifier for amplifying the signals; and
      (3) a speaker for converting the amplified signals into output sound;
   (b) a filter coupled to the combination for providing compensation for acoustic feedback; and
   (c) means for selecting the location of the notch to reduce the effect of acoustic feedback
   (d) said filter comprising:
      (1) input and output terminals; and
      (2) means converting the terminals with $m+1$ gain parameters having the form $\beta_0, \beta_1, \ldots, \beta_m$, and n gain parameters having the form $\alpha_0, \alpha_1, \ldots \alpha_n$ such that $$\frac{y(t)}{u(t)} = \frac{\beta_0 + \beta_1 D + \ldots + \beta_m D^m}{1 + \alpha_0 D + \ldots + \alpha_n D^n}$$

Where D is a delay operator operating in the filters output and input signals y(t) and u(t), respectively, such that $Dy(t)=y(t-D)$, etc.;

(3) the gain parameters satisfying the relationship $$\sum_{i=0}^{n} \alpha_i y_{k-i} = \sum_{j=0}^{m} \beta_j r_{k-j+v}$$

where $n=0,1,2,\ldots$; $m=0,1,2,\ldots$; k is an integer; v is an integer determining the slope of the phase shift versus frequency response of the filter; and $y_k$ and $r_k$ are the kth elements of an output sequence and a random sequence, respectively, the output sequence being the sequence obtained by convolving a truncated sequence of coefficients with the random sequence, the truncated sequence being a sequence obtained by truncating the sequence of coefficients resulting from performing an inverse Fourier transform on said arbitrarily selected frequency spectrum.

17. A hearing aid according to claim 16 wherein $n=0$.

18. A hearing aid according to claim 16 wherein $m=0$.

* * * * *